US010379254B2

(12) United States Patent
Marzaki et al.

(10) Patent No.: US 10,379,254 B2
(45) Date of Patent: Aug. 13, 2019

(54) METHOD FOR PRODUCING AN INTEGRATED CIRCUIT POINTED ELEMENT COMPRISING ETCHING FIRST AND SECOND ETCHABLE MATERIALS WITH A PARTICULAR ETCHANT TO FORM AN OPEN CRATER IN A PROJECTION

(71) Applicant: STMicroelectronics (Rousset) SAS, Rousset (FR)

(72) Inventors: Abderrezak Marzaki, Marseilles (FR); Yoann Goasduff, Fuveau (FR); Virginie Bidal, Fuveau (FR); Pascal Fornara, Pourrières (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 14/985,037

(22) Filed: Dec. 30, 2015

(65) Prior Publication Data
US 2016/0116631 A1 Apr. 28, 2016

Related U.S. Application Data

(62) Division of application No. 14/049,910, filed on Oct. 9, 2013.

(30) Foreign Application Priority Data

Nov. 16, 2012 (FR) .................... 12 60912

(51) Int. Cl.
*H01H 9/02* (2006.01)
*H01H 37/42* (2006.01)
(Continued)

(52) U.S. Cl.
CPC ............... *G01V 7/04* (2013.01); *B81B 3/001* (2013.01); *B81C 1/00111* (2013.01);
(Continued)

(58) Field of Classification Search
CPC .... H01L 21/32139; H01L 28/88; H01H 37/42
See application file for complete search history.

(56) References Cited

U.S. PATENT DOCUMENTS 5,256,587 A * 10/1993 Jun ..................... G03F 7/094
148/DIG. 138
5,510,156 A * 4/1996 Zhao ..................... B81B 3/001
216/12
(Continued)

FOREIGN PATENT DOCUMENTS

DE 4229837 A1 3/1993
FR 2681178 A1 3/1993
(Continued)

OTHER PUBLICATIONS

French Search Report received in Application No. 1260912 dated Apr. 5, 2013, 7 pages.
(Continued)

*Primary Examiner* — Anh D Mai
(74) *Attorney, Agent, or Firm* — Slater Matsil, LLP

(57) ABSTRACT

A method for producing an integrated circuit pointed element is disclosed. An element has a projection with a concave part directing its concavity towards the element. The element includes a first etchable material. A zone is formed around the concave part of the element. The zone includes a second material that is less rapidly etchable than the first material for a particular etchant. The first material and the second material are etched with the particular etchant to form an open crater in the concave part and thus to form a pointed region of the element.

22 Claims, 8 Drawing Sheets

(51) Int. Cl.
*H01H 61/013* (2006.01)
*G01V 7/04* (2006.01)
*B81B 3/00* (2006.01)
*B81C 1/00* (2006.01)
*H01L 49/02* (2006.01)
*H01H 37/04* (2006.01)
*H01H 37/32* (2006.01)
*H01L 21/3213* (2006.01)
*H01L 29/423* (2006.01)

(52) U.S. Cl.
CPC ............ *H01H 37/04* (2013.01); *H01H 37/32* (2013.01); *H01L 21/32139* (2013.01); *H01L 28/82* (2013.01); *H01L 29/4238* (2013.01); *B81B 2201/018* (2013.01); *B81B 2201/0235* (2013.01); *B81B 2201/0242* (2013.01); *B81B 2203/0361* (2013.01); *B81B 2203/04* (2013.01); *H01H 9/02* (2013.01); *H01H 37/42* (2013.01); *H01H 61/013* (2013.01); *H01L 28/88* (2013.01)

(56) References Cited

U.S. PATENT DOCUMENTS

| | | | |
|---|---|---|---|
| 5,783,473 A | 7/1998 | Sung | |
| 5,973,353 A * | 10/1999 | Yang | H01L 29/42324 257/315 |
| 6,103,592 A * | 8/2000 | Levy | H01L 21/76229 257/E21.548 |
| 6,229,684 B1 * | 5/2001 | Cowen | F03G 7/06 361/277 |
| 6,268,620 B1 | 7/2001 | Ouellet et al. | |
| 6,410,957 B1 | 6/2002 | Hsieh et al. | |
| 6,436,789 B2 | 8/2002 | Sawamura | |
| 6,503,828 B1 | 1/2003 | Nagahara et al. | |
| 6,635,922 B1 | 10/2003 | Hsieh et al. | |
| 6,984,860 B2 | 1/2006 | Grivna et al. | |
| 7,986,507 B2 * | 7/2011 | Shimanouchi | H01G 5/01 361/272 |
| 2003/0058069 A1 * | 3/2003 | Schwartz | H01H 59/0009 335/78 |
| 2003/0119257 A1 | 6/2003 | Dong et al. | |
| 2004/0053475 A1 * | 3/2004 | Sharma | H01L 21/0337 438/424 |
| 2009/0115064 A1 | 5/2009 | Sandhu et al. | |
| 2012/0178255 A1 | 7/2012 | Yang et al. | |
| 2013/0105868 A1 * | 5/2013 | Kalnitsky | G01N 27/414 257/288 |
| 2014/0266562 A1 | 9/2014 | Di-Giacomo et al. | |
| 2015/0014794 A1 | 1/2015 | Di-Giacomo et al. | |

FOREIGN PATENT DOCUMENTS

| | | | | |
|---|---|---|---|---|
| FR | 2984013 A1 | 6/2013 | | |
| FR | 2988712 A1 | 10/2013 | | |
| WO | WO 2013083385 A1 * | 6/2013 | | H01H 61/00 |

OTHER PUBLICATIONS

Guan, Huinan, et al., "An Analytical Model for Optimization of Programming Efficiency and Uniformity of Split Gate Source-Side Injection Superflash Memory," IEEE Transactions on Electron Devices, vol. 50, No. 3, Mar. 2003, 7 pages.

Kianian, S., et al., "A Novel 3 Volts-Only, Small Sector Erase, High Density Flash E2PROM," 1994 Symposium on VLSI Technology Digest of Technical Papers, 1994 IEEE, 2 pages.

Kotov, A. et al., "Tunneling Phenomenon in Superflash® Cell," 2002 IEEE Nonvolatile Memory Technology Symposium, p. 110-115.

Vayrette, R. et al., "Residual stress estimation in damascene copper interconnects using embedded sensors," Microelectronic Engineering 87 (2010) 4 pages.

* cited by examiner

FIG. 11
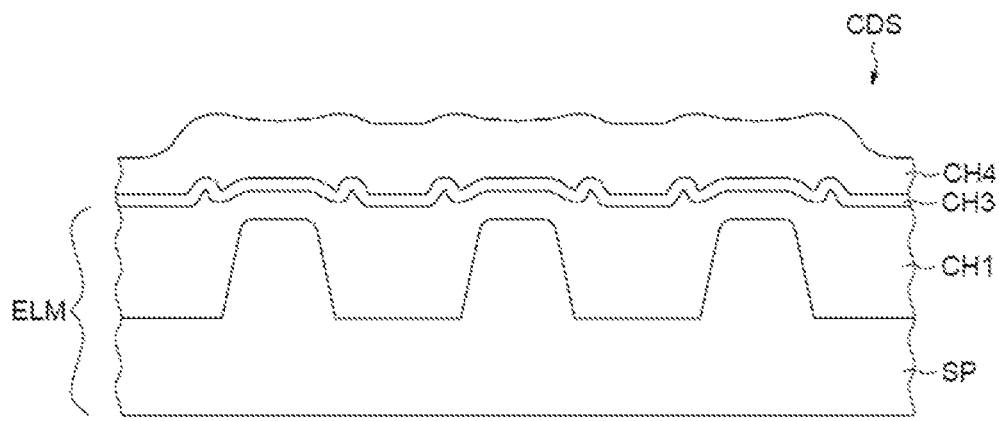
FIG. 12
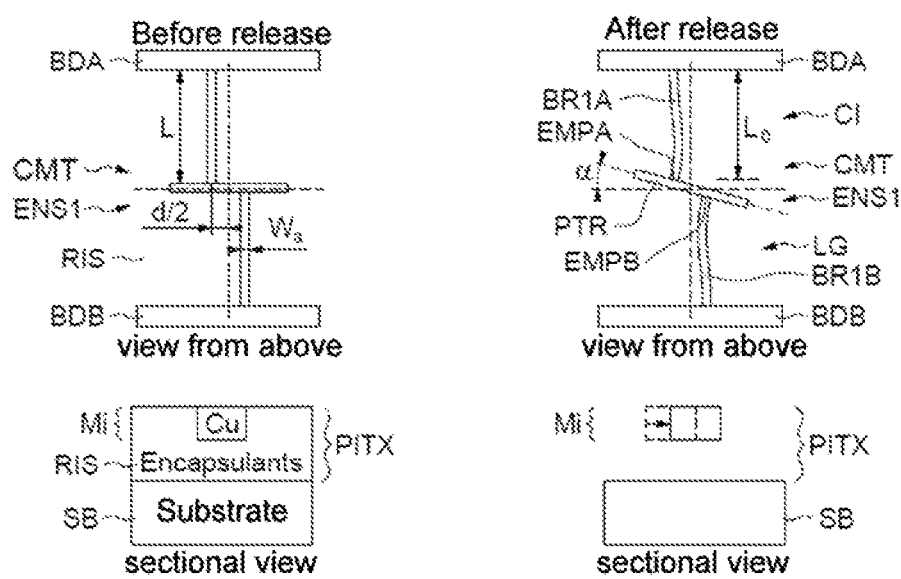
FIG. 12A          FIG. 12B

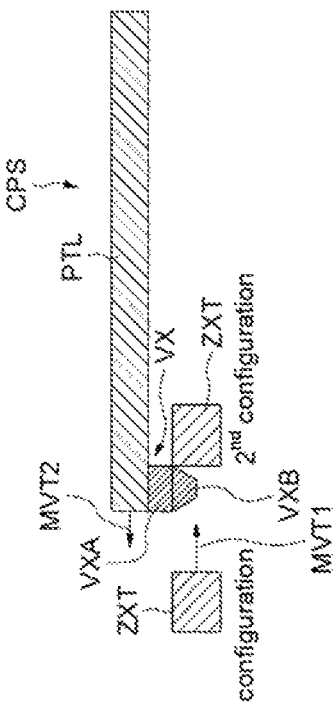
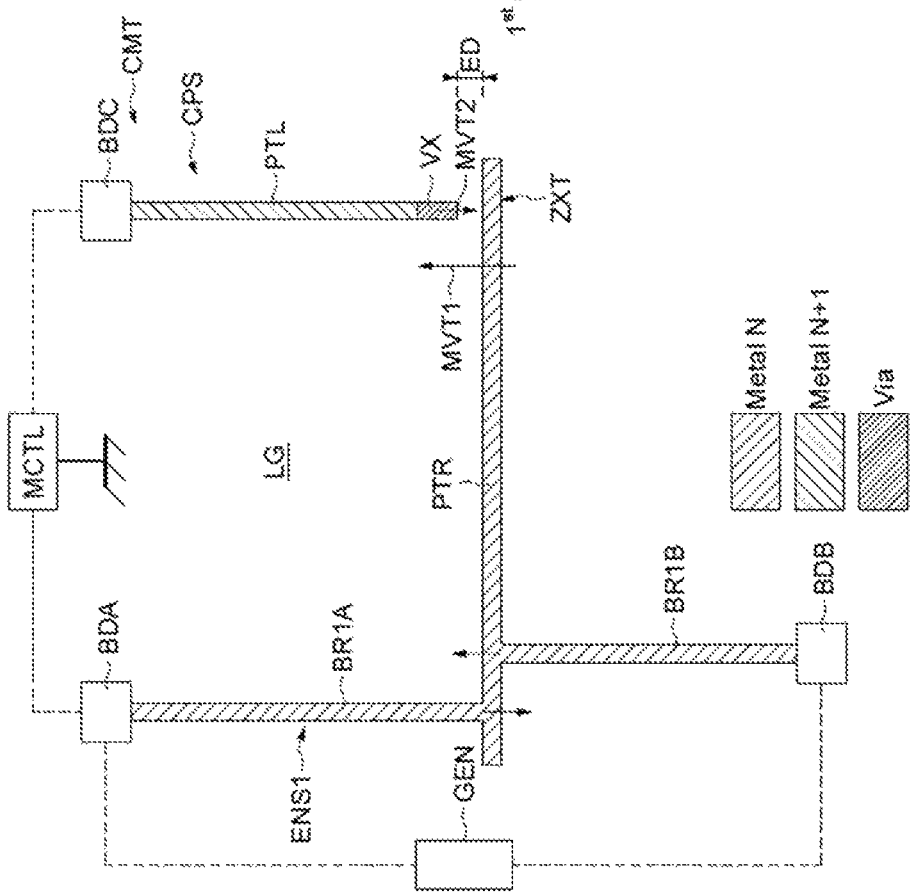

METHOD FOR PRODUCING AN INTEGRATED CIRCUIT POINTED ELEMENT COMPRISING ETCHING FIRST AND SECOND ETCHABLE MATERIALS WITH A PARTICULAR ETCHANT TO FORM AN OPEN CRATER IN A PROJECTION

This application is divisional of U.S. application Ser. No. 14/049,910, filed on Oct. 9, 2013, which claims priority to French Patent Application 1260912, which was filed Nov. 16, 2012, each of which is incorporated herein by reference.

TECHNICAL FIELD

The invention relates to integrated circuits and, in particular embodiments, to the formation of tips in and/or on an integrated circuit.

BACKGROUND

The tip effect is used in certain devices, especially to increase the field effect.

Thus, it is known, in charge-storage nonvolatile memories, to create tips on the polysilicon floating gate, so as to facilitate the injection of carriers into the upper gate.

It is possible in this regard to cite U.S. Pat. Nos. 5,783,473, 6,410,957 and 6,635,922 as well as the following articles:

"An Analytical Model for Optimization of Programming Efficiency and Uniformity of Split Gate Source-Side Injection Superflash Memory", Huinan Guan, IEEE Transactions on Electron Devices, vol. 50, No. 3, March 2003, "A Novel 3 Volts-Only, Small Sector Erase, High Density Flash $E^2PROM$", Sohrab Kianian et al., 1994 Symposium on VLSI Technology Digest of Technical Papers, 1994 IEEE, "Tunneling Phenomenon in Superflash® Cell", A. Kotov et al., 2002 IEEE Nonvolatile Memory Technology Symposium, p. 110-115.

The formation of the tips of the floating gate comprises an oxidation of the polysilicon of this floating gate.

SUMMARY

The conventional method is limited to the fabrication of tips on a polysilicon region in the part of the integrated circuit customarily designated by the person skilled in the art under the acronym "FEOL" (Front End Of Line) and requires a significant thermal budget.

According to one mode of implementation, it is proposed to produce tips in an integrated circuit, both in the FEOL part and in the interconnection part situated above this FEOL part and commonly designated by the person skilled in the art under the acronym "BEOL" (Back End Of Line), while preserving substantially the same thermal budget as that used customarily for producing an integrated circuit, and without being limited to polysilicon.

According to one aspect, a method for producing an integrated circuit pointed element comprises formation of an element possessing at least one projection having a concave part directing its concavity towards the element and comprising a first etchable material. The material can be, for example, polysilicon or a metallic material such as aluminum. A formation around the concave part of a zone comprises a second material less rapidly etchable than the first material, for example a material used in the so-called "BARO" (Bottom Anti Reflective Coating) anti-reflection layers, or else a resin or indeed a carbonaceous layer.

The method also comprises an etching of the first material and of the second material so as to form an open crater in the concave part and thus to form a pointed region of the element.

Thus, according to this aspect, the formation of tips is obtained simply by etching two materials at the level of a concave projection, and, the selectivity of etching as well as the duration of etching make it possible to adjust the depth and the width of the crater, thereby making it possible to adjust the height of the tips as well as the opening of the pointed region. The use of etching(s) makes it possible to avoid a significant thermal budget for the formation of these tips.

Moreover, these production steps can be performed at any site of the integrated circuit, be it in the FEOL part or in the BEOL part, and with any materials, provided that the materials used are etchable.

According to one mode of implementation, the formation of the zone comprising the second material, comprises a formation of a layer of the second material above and around the at least one concave part, and a removal, for example by a mechanochemical polishing, of a part of this layer so as to abrade the crown of this concave part, and the formation of the crater then comprises the simultaneous etching of the first material and of the second material.

It is also possible, after the etching of the first material and of the second material, to remove the second material, so as to release the exterior of the pointed region.

Preferably, the element and the at least one projection comprise the same first material. Stated otherwise, the element and its projection or projections are formed of one and the same material.

In this case, according to one mode of implementation, the formation of the element comprises a formation of a support, made for example of silicon or else silicon oxide, comprising at least one salient block and a compliant deposition of a layer of the first material on the support, the part of the layer overlapping the at least one block forming the at least one projection.

In this case, the projection can take the form of a dome, autoaligned on the subjacent salient block.

According to one mode of implementation, it is possible to form an element possessing several projections and to form the zone comprising the second material around each concave part and between two adjacent concave parts. An etching of the first material and of the second material is then undertaken so as to form an open crater in each concave part, and thus to form several pointed regions.

The formation of the element can comprise a formation of a support comprising several salient blocks and a compliant deposition of a layer of the first material on the support, the part of the layer overlapping the blocks forming the projections.

According to another aspect, a device comprises at least one element of an integrated circuit having at least one projection, comprising in its upper part a pointed region limiting an open crater whose opening is smaller than the distance, reckoned at the level of the bottom of the crater, between two points of the external wall of the pointed region that are substantially opposite with respect to the center of the crater. Stated otherwise, the pointed region broadens out in the direction of its base the further one recedes from the center of the crater.

According to one embodiment, the external wall of the pointed region exhibits a concave profile extending from the opening of the crater and directing its concavity towards the crater.

The crater can exhibit a hollowed part at the foot of the internal wall of the pointed region.

According to one embodiment, the device furthermore comprises a support possessing at least one salient block, and the element is then situated above the support with the pointed region autoaligned with the block.

According to one embodiment, the at least one projection and the remainder of the at least one element comprise one and the same first material.

The at least one element can comprise several projections, each possessing a pointed region.

According to another aspect, there is proposed an integrated circuit comprising at least one device such as defined hereinabove.

The integrated circuit can comprise for example at least one capacitor, at least one electrode of which is formed by the at least one pointed element of the device.

According to one embodiment, the at least one element of the device is metallic and is situated on at least one of the metallization levels of the interconnection part (BEOL) of the integrated circuit.

The use of pointed elements, in particular metallic, in an integrated circuit can find numerous applications.

Thus, in addition to an application to a capacitor, a pointed element such as this can be used to release a beam of a mechanical system for electrical switching or else to reduce the contact area, and therefore the risk of sticking, of a body moving on a plane wall, such as for example in a system for detecting orientation of the integrated circuit.

More precisely, according to one embodiment, the integrated circuit comprises, within the interconnection part (BEOL), a mechanical system for electrical switching comprising in a housing at least one first thermally deformable assembly including a beam held in at least two different places by at least two arms secured to edges of the housing. The beam and the arms are metallic and situated within one and the same first metallization level. The system also comprises an electrically conducting body. The first assembly has at least one first configuration when it has a first temperature and a second configuration when at least one of the arms has a second temperature different from the first temperature. The beam is remote from the body in one of the configurations and in contact with the body and immobilized by the body in the other configuration so as to be able to establish or prohibit an electrical link passing through the body and through the beam. The first assembly is activatable to pass from one of the configurations to another. The mechanical system furthermore comprises a release mechanism configured to release a beam immobilized by the body and comprising the at least one pointed element whose at least one pointed region is directed towards the body, as well as a way to generate at the level of the at least one pointed region an electrostatic field.

According to another embodiment, the integrated circuit can comprise, within the interconnection part, at least one mechanical system for detecting spatial orientation and/or change of orientation of the integrated circuit. This mechanical system comprises a housing whose walls comprise metallic portions produced within various metallization levels. The housing comprises a floor wall and a ceiling wall. The detection system also comprises a metallic piece housed in the housing and mobile inside the housing. A check mechanism is defines an evolution zone inside the housing for the metallic piece and comprises at least two electrically conducting elements disposed at the boundary of the evolution zone. At least one of the floor and ceiling walls incorporates the at least one element directing its pointed region towards the metallic piece inside the evolution zone. The piece is configured so as, under the action of gravity, to come into contact with the at least two electrically conducting elements, in response to at least one given spatial orientation of the integrated circuit. The system also comprises a detector to detect an electrical link passing through the piece and the at least two electrically conducting elements.

BRIEF DESCRIPTION OF THE DRAWINGS

Other advantages and characteristics of the invention will be apparent on examining the detailed description of wholly non-limiting modes of implementation and embodiments, and the appended drawings in which:

FIGS. 1 to 11 illustrate various modes of implementation and embodiments of a device and of an integrated circuit according to the invention, FIGS. 12 to 17 illustrate another embodiment of an integrated circuit according to the invention.

DETAILED DESCRIPTION OF ILLUSTRATIVE EMBODIMENTS

Figure 1:
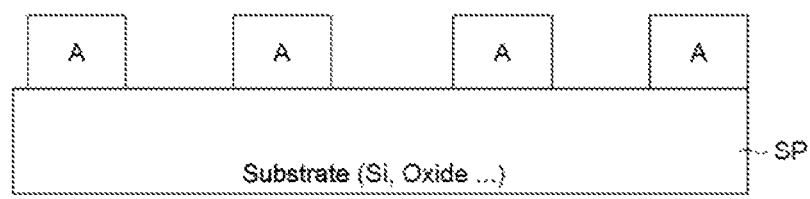

In FIG. 1, the reference SP designates a support or substrate, (for example silicon, polysilicon, silicon oxide, etc.).

As will now be seen in greater detail, a pattern comprising hollows and salient blocks (or bumps) will be produced in this support.

In this regard, as illustrated in FIG. 1, the location of the hollows of the pattern is defined in a conventional manner by a photolithography step using a photosensitive resin A.

Figure 2:
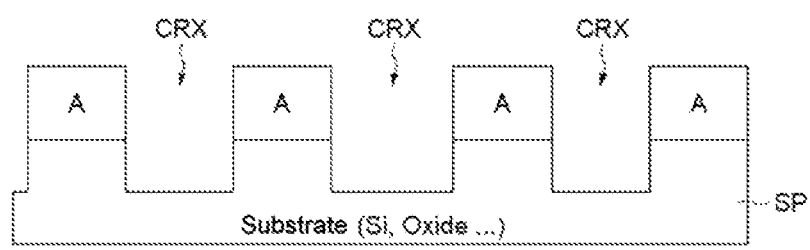

Next, an etching of the support SP is undertaken in a conventional manner between the resin pads so as to form the hollows CRX of the pattern (FIG. 2).

Figure 3:
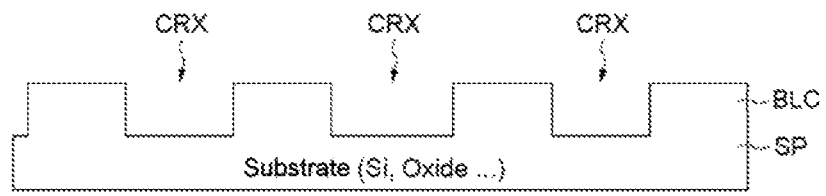

After removal of the resin blocks, the support SP is obtained. As illustrated in FIG. 3, the support SP comprises salient blocks BLC separated by hollows CRX.

Figure 4:
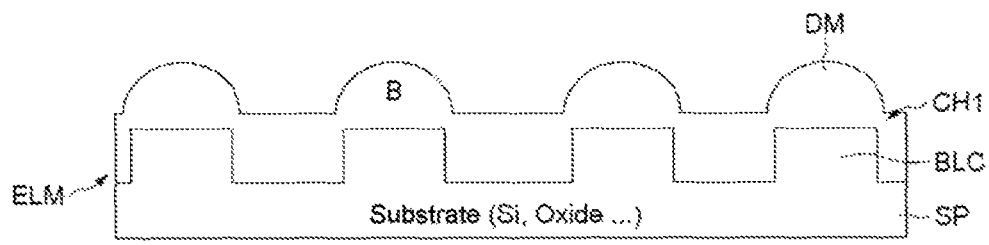

Next, as illustrated in FIG. 4, a layer CH1 of a first material B is formed on the support SP. The layer CH1 comprises projections formed above and autoaligned with the subjacent salient blocks BLC. In this example, the projections are in the form of domes DM.

This layer CH1 therefore forms an element ELM resting on the support SP and comprising several projections DM.

This element ELM and its projections DM are formed of a first etchable material B which may be for example silicon, polysilicon, silicon dioxide, silicon nitride, or else a metal such as aluminum or tungsten, without this list being exhaustive.

By way of indication, when the first metal forming the layer CH1 is aluminum, the deposition of this metal can be a Physical Vapor Deposition (termed "PVD deposition"). When the first material is an oxide, it is then possible to use a Chemical Vapor Deposition (termed "CVD deposition").

Such depositions are conventional and known per se.

In the following step, illustrated in FIG. 5, a layer CH2 of a second material C is formed on the structure obtained in FIG. 4. The second material C is also etchable and in this example possesses a planar upper surface. This formation can be performed in various ways, for example by depositing a planarizing material or else by performing a compliant deposition of this material C followed by a mechanochemical polishing.

By way of nonlimiting example, it is possible to use as planarizing material a material used in the so-called BARC anti-reflection layers. Thus, it is possible to use, for example, a material of the type $SiO_xN_y$. When oxide is used as material C, it is possible to deposit it by a so-called HDP (High Density Plasma) method or else to perform a compliant oxide deposition followed by a mechanochemical polishing.

Be that as it may, the second material C should be able to be etched less rapidly than the first material B.

Indeed, it is this difference in etching speed or this selectivity of etching, that will allow the creation of a pointed region in each dome DM.

Figure 5:
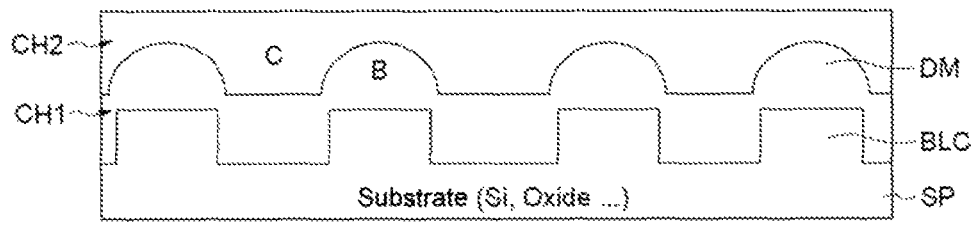
Figure 6:
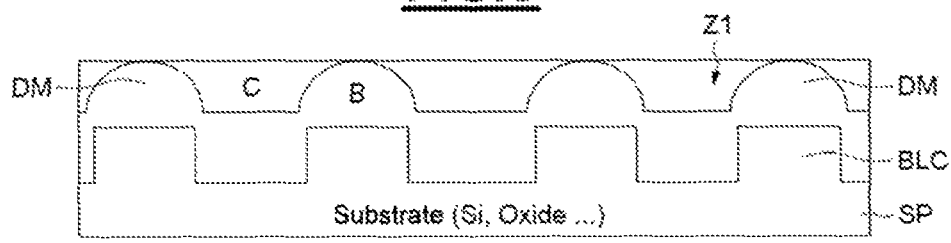

More precisely, on the basis of the structure illustrated in FIG. 5, a removal of the upper part of the layer CH2 is undertaken, so as to abrade the crown of each concave part, as illustrated in FIG. 6. At this juncture, around each concave part DM and between two adjacent concave parts is a zone Z1 filled with the second material C.

Figure 7:
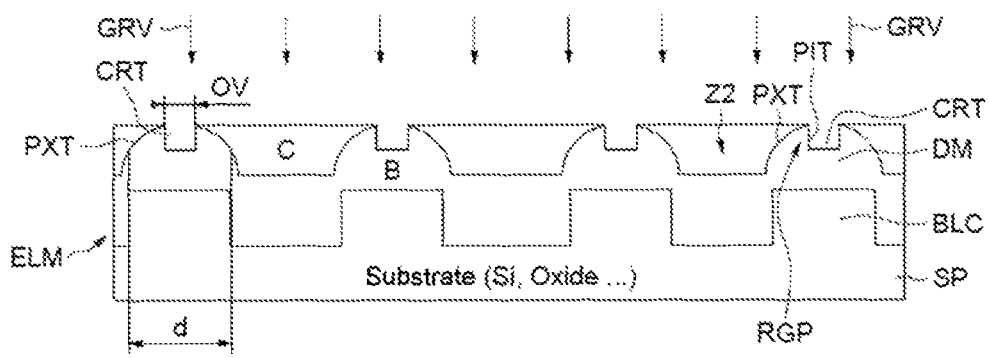

Next, as illustrated in FIG. 7, a selective, isotropic or anisotropic, etching GRV of the material B and of the material C is undertaken so as to open in each concave projection DM, a crater CRT.

By way of indication, the selectivity of the etching can be of the order of 1 for 2 or of 1 for 4.

Thus, for example, when the first material B is polysilicon and the second material C is a material of BARC type, it is possible to use plasma etching using a $ClHBrO_2$ plasma. This etching is typically performed at 60° C. and the selectivity is then of the order of 1/2.

When the first material B is aluminum, and the second material C is also a material of BARC type, a $BCl_3ArO_2$ plasma can be used as plasma for the etching. This time the etching is performed at 40° C. and here again the selectivity is of the order of 1/2.

It should be noted that to pass from the structure of FIG. 5 to that of FIG. 6, that is to say, to remove the upper part of the layer $CH_2$ of the second material C, it is possible either to use specific etching and then to use selective etching when in the situation of FIG. 6, or else to use right from the outset the etching which will be used to selectively remove the materials B and C.

When the structure is in the state illustrated in FIG. 6, the selective etching GRV hollows out the first material B more deeply than the second material C, creating at the start a narrow crater. Next, as the material C of each zone Z1 is etched, an additional part of the dome DM is uncovered, and then etched by the etching GRV. Thus, in tandem with the etching operation GRV, the crater CRT is hollowed out and widened. The dimensions of the crater therefore depend on the selectivity of etching and the duration of etching.

On completion of the etching operation GRV, the structure illustrated in FIG. 7 is obtained, in which the pointed element ELM comprises the lower part of the layer CH1, crenellated, as well as concave projections DM comprising, in their upper part, a pointed region RGP whose internal wall PIT limits a crater CRT. Moreover, the opening OV of the crater is smaller than the distance d, reckoned at the level of the bottom of the crater, between two points of the external wall PXT of the pointed region which are substantially opposite with respect to the center of the crater.

The pointed region RGP broadens out therefore from the pointed end towards the base the further one recedes from the center of the crater.

The external wall PXT of the pointed region exhibits here a concave profile extending from the opening OV of the crater while directing its concavity towards the crater.

Moreover, the pointed region RGP is autoaligned with the subjacent salient block BLC of the support SP, that is to say, the axis of symmetry of the block BCL coincides exactly or nearly with the axis of symmetry of the pointed region RGP.

In general, it is possible thereafter to undertake total removal of the material C situated in the zones Z2 between the pointed regions. This can be performed by a totally selective etching aimed this time at etching the material C without etching the material B.

It is also possible in certain applications, as will be seen in greater detail hereinafter, to also remove by a selective etching operation, the support SP supporting the element ELM so as for example to form a metallic beam in the BEOL part of an integrated circuit.

Figure 8:
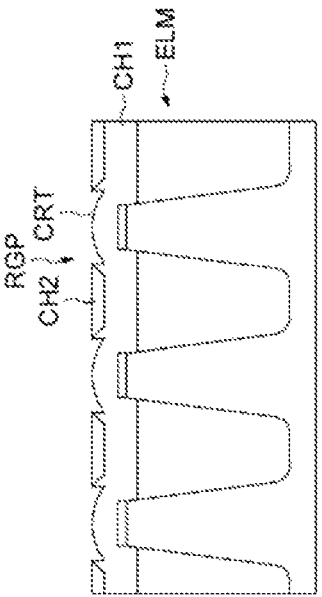
Figure 9:
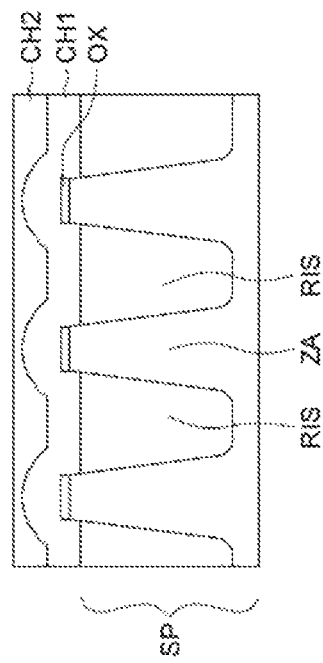

In FIG. 8, the support SP comprises active zones ZA, of silicon or polysilicon, mutually separated by isolating regions RIS, for example of the shallow trench type (STI: Shallow Trench Isolation). Each active zone is surmounted by a gate oxide OX. The isolating regions RIS have been slightly etched in such a way that the active regions ZA surmounted by the gate oxides OX form the salient blocks leading to the formation of the domes of the layer CH1 of the first material.

The layer CH1 is surmounted by the layer CH2. In the example described here, the layer CH1 can be polysilicon while the layer CH2 is here again for example a material of BARC type.

In a manner analogous to what was described hereinabove, the etchings of the materials of the layers CH1 and CH2 are undertaken so as to form in the layer CH1 pointed regions RGP delimiting craters CRT, the pointed regions RGP being autoaligned with the subjacent active zones.

It will thus be possible, after subsequent etching treatments, to delimit gates equipped with tips. As a variant, these etching treatments making it possible to delimit the gates can be performed before the formation of the tips.

Figure 10:
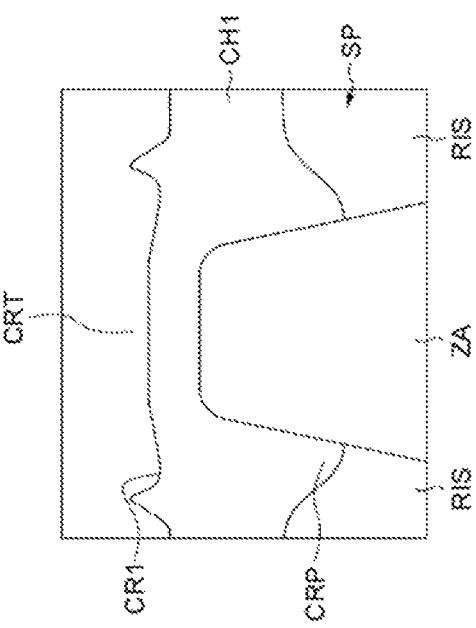

It is seen in FIG. 10 that the etching of the zones RIS has caused a hollowed profile CRP between the edge of the active zone ZA and the edge of the isolating region RIS. Therefore, on account of the compliant deposition of the layer CH1 and the selective etching, the crater CRT exhibits a hollowed part CR1 at the foot of the internal wall of the pointed region.

By way of indication, the method makes it possible to obtain heights of tips from 300 to 400 Ängstroms without this range of values being limiting.

It is possible, as illustrated in FIG. 11, to produce within an integrated circuit a capacitor CDS, at least one of whose electrodes, here the lower electrode, comprises a pointed element.

More precisely, in this example, the pointed element ELM comprises a substrate SP, of, for example, silicon dioxide, surmounted by the first layer CH1, of, for example, polysilicon, comprising several pointed regions and forming the lower electrode of the capacitor CDS. A dielectric layer CH3 is thereafter deposited on the layer CH1 and the second electrode CH4 of the capacitor, for example also of polysilicon, is thereafter deposited on the dielectric layer CH3.

A capacitor having an increased inter-electrode area relative to a capacitor whose two electrodes are plane is therefore obtained. And, for equal capacitive value, it is therefore possible to reduce the surface area of the capacitor on the silicon, for example of the order of several tens of percent.

Reference is now made more particularly to FIGS. 12 to 17 to illustrate an application of a pointed element to a mechanical switching system disposed in the interconnection part PITX (or BEOL) of an integrated circuit.

An exemplary mechanical switching system is described in French patent application No. 1161410.

Certain characteristics thereof are now recalled hereinafter.

Referring to FIG. 12, which includes FIGS. 12A and 12B, it is seen that the mechanical switching system or switch CMT here comprises a first assembly ENS1 produced within one and the same metallization level Mi of the interconnection part PITX of the integrated circuit CI.

This part PITX is situated above the substrate SB.

The switch CMT is in this example metallic, for example aluminum.

The switch CMT here comprises an assembly ENS1 in the form of an asymmetric cross. This assembly ENS1 comprises a first arm BR1A and a second arm BR1B secured to a beam PTR, also dubbed the "central pointer", at two locations EMPA and EMPB respectively situated on two opposite faces of the beam PTR. These two locations EMPA and EMPB are spaced a distance d apart.

FIG. 12A shows the switch CMT, and more particularly the assembly ENS1 encapsulated in an isolating region RIS while FIG. 12B shows the same assembly after etching of the isolating region so as to release the arms BR1A and BR1B as well as the beam PTR.

The assembly ENS1, thus released, therefore extends inside a housing LG resulting from the removal of the isolating region RIS, the two arms BR1A and BR1B being secured to the edges BDA and BDB of the housing.

It was shown in the article by R. Vayrette et al. entitled: "Residual stress estimation in damascene copper interconnects using embedded sensors", Microelectronics Engineering 87 (2010) 412-415, that after de-encapsulation of an assembly of this type, there is stress relaxation, which causes a residual longitudinal deformation of the arms causing a deviation a of the pointer, here clockwise.

More precisely, assuming an arm of constant width Wa, the deviation a is expressed by the following formula:

$$a = \frac{d \cdot L \cdot L_0 (L - L_0)}{d^2 (2L - L_0) + \frac{4}{3} \cdot W_a^2 \cdot L_0}$$

where $L_0$ is the length of the arm after relaxation,
$L_0$ is equal to $$\frac{L}{1 + \frac{\sigma}{E}}$$

where σ designates the residual mean longitudinal stress and E the Young's modulus of the material.

σ is determined experimentally on the basis of measurements performed on test structures exhibiting various values of d and various values of Wa.

According to the applications which will be envisaged, and especially according to the precision desired, for example in the case of temperature detection, it will be possible to take account or not take account of this residual deviation a of the pointer PTR.

In this regard, and in a general manner, knowing the thermal expansion coefficient of the material forming the expansion arms, the geometry of the arms, especially their length and their width as well as their thickness, and the spacing d between the two fixing points, it is readily possible to simulate, especially by calculations of moments of forces, the deviation of the pointer PTR during a temperature rise or a temperature fall.

In the embodiment illustrated in FIG. 13 and FIG. 14, the arms BR1A and BR1B of the assembly ENS1 are fixed in the vicinity of a first end zone of the beam PTR, the other end zone ZXT of this beam PTR being free. The switch CMT moreover comprises an electrically conducting body CPS here comprising a cantilever beam PTL secured to a part BDC of an edge of the housing LG, as well as a metallic appendage VX situated at the free end of the beam PTL.

As seen more particularly in FIG. 14, the beam PTR (as well as the arms BR1A and BR1B of the assembly ENS1) is produced within a first metallization level, namely here the metallization level N while the cantilever beam PTL of the body CPS is produced within another metallization level different from the first metallization level, in this instance the metallization level N+1.

Moreover, the appendage VX of the body CPS is produced within the level of vias, situated between the metallization levels N and N+1. The appendage VX is produced in a manner analogous to that used for producing the vias in the BEOL part of the integrated circuit. That said, the appendage VX comprises a part VXA extending between the two metallization levels N and N+1, and prolonged by an end part VXB extending in part within the first metallization level N. This end part VXB broadens out towards the cantilever beam PTL.

In FIG. 13, the assembly ENS1 is in a first configuration, for example when it is at ambient temperature. During a rise in temperature of the integrated circuit, and consequently of the assembly ENS1, the arms BR1A and BR1B of the assembly expand and therefore, the end ZXT of the beam PTR undergoes a motion MVT1 that is manifested here by a sagging. Moreover, the cantilever beam PTL of the body CPS expands and its free end, supporting the appendage VX, moves according to a motion MVT2.

Therefore, and having regard to the fact that the amplitude of these motions can readily be calculated as indicated hereinabove as a function especially of the geometry of the arms and of the coefficients of expansion of the materials, the spacing ED between the end ZXT of the beam PTR and the via VX, in the first configuration, is determined in such a way that beyond a certain temperature, the assembly ENS1 takes a second configuration in which, as illustrated in FIG. 14, the end zone ZXT of the beam PTR comes from the other side of the via VX, thus being immobilized and hooked by the via VX of the body CPS.

Passage of the end zone ZXT of the beam PTR from one side to the other of the via VX is rendered possible especially by the beveled shape of the end part VXB of the via VX and also by the fact that the beam PTL mounted cantilever fashion, will inflect when the end zone ZXT comes into contact with the beveled part VXB of the via VX, and allow, by this raising, passage of the zone ZXT on the other side of the via.

Once the zone ZXT has passed the other side of the via (second configuration) the via VX can descend again and hook the zone ZXT by being in contact with the latter.

And, in this second configuration, the beam PTR of the assembly ENS1 cannot naturally return to its first configuration even if the temperature returns to the initial temperature since the beam PTR is locked by the via VX.

In the second configuration, it therefore becomes possible to establish an electrical link passing through the body CPS and through the beam PTR.

Check mechanism MCTL, disposed for example in another part of the integrated circuit, can thus test the establishment or otherwise of this electrical link.

In this regard, it will be possible to use any conventional and known means. The mechanism MCTL can for example comprise a generator able to generate a supply voltage on the edge BDA of the housing LG and verify, for example with the aid of logic circuits, that the current thus generated is indeed present at the level of the edge BDC of the housing, the edges BDA and BDC being electrically insulated.

Figure 15:
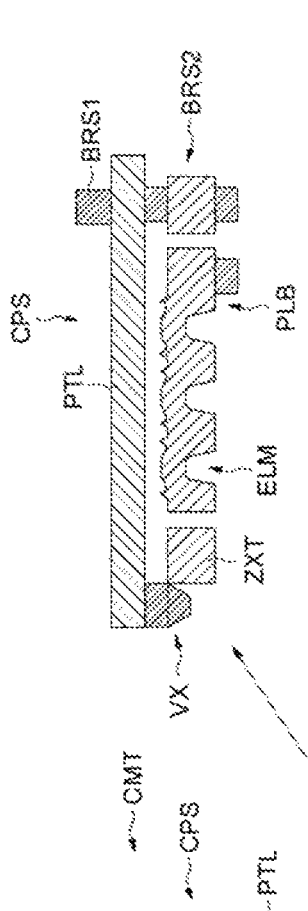
Figure 16:
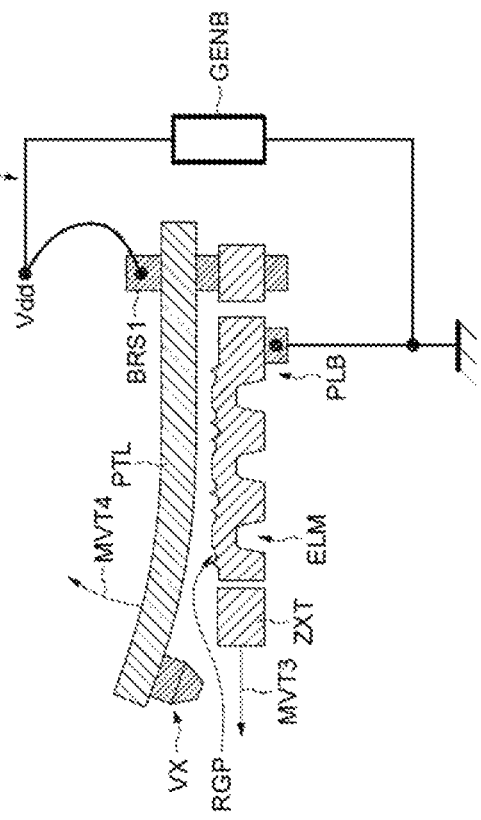
Figure 17:
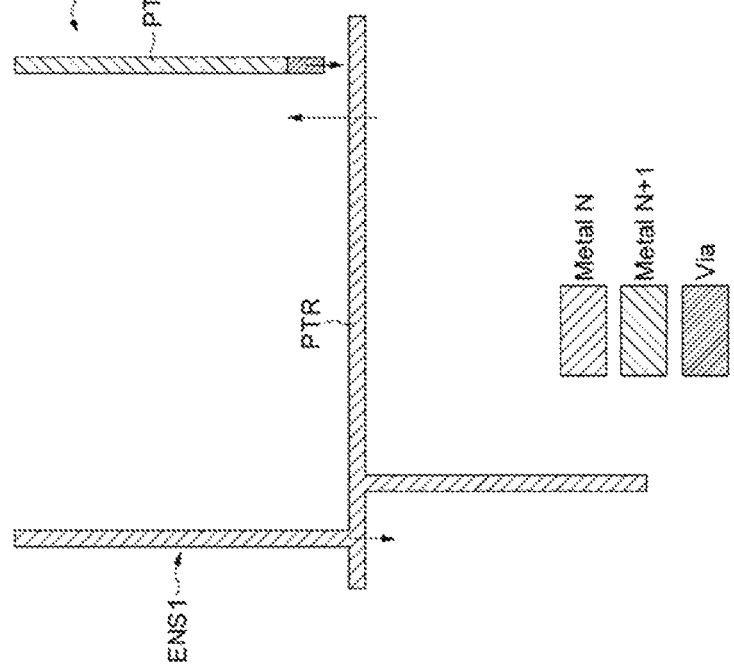

Whereas in the embodiment illustrated in FIGS. 13 and 14, the switch CMT possessed a naturally irreversible state, as explained hereinabove, it is possible, as illustrated in FIGS. 15, 16 and 17, to provide for the switch furthermore to comprise a mechanism MLB configured to release a beam immobilized by the body CPS.

In the example illustrated in FIGS. 15 to 17, the mechanism MLB here comprise, as illustrated in FIG. 16, a first arm BRS1 formed by a via, and a second arm BRS2 formed here by a metallic portion situated at the metal level N and by two vias disposed either side of this metallic portion.

The arms BRS1 and BRS2 are secured to the beam PTL in the vicinity of the end opposite from that to which the appendage VX is linked.

These arms BRS1 and BRS2 make it possible to immobilize the beam PTL and to permit simply as will be seen hereinafter, vertical sagging.

In addition to these arms BRS1 and BRS2, the mechanism MLB also comprise, as illustrated in FIG. 16, another beam PLB held fixed at its right end, for example by way of a via. This beam PLB, produced at the metal level N, comprises in its left part a metallic, for example aluminum, pointed element ELM having a structure analogous to that which was described with reference to FIG. 7 for example. It will be noted here that the element ELM is ridded here of the subjacent support that served for its formation, as well as of the second material that served for the formation of the pointed regions. The pointed regions RGP are directed towards the beam PTL of the body CPS.

The mechanism MLB also comprise a mechansim GENB able to generate a potential difference between the beam PTL and the beam PLB and thus to create at the level of the tips of the pointed element ELM an electrostatic field so as to create a repulsion effect which will make it possible to inflect the beam PTL upwards (motion MVT4). And, it is seen in FIG. 17 that on account of the sagging of the beam PTL, the beam PTR is freed from its immobilization constraints by the appendage VX and therefore returns to its initial configuration (motion MVT3).

The switch CMT is then as it were reinitialized and can be used again to, for example, detect the crossing of a temperature threshold or a surge.

The switch CMT and especially the assembly ENS1 as well as the body CPS are produced by carrying out conventional steps for fabricating metallization levels and vias. The levels of vias are also used to form a protection wall for the oxide etching which will allow de-encapsulation of the assembly ENS1 and of the body CPS.

Moreover, the beam PLB and especially the element ELM is produced in a manner analogous to what was described hereinabove with reference to FIGS. 1 to 7 by using for example as subjacent support silicon dioxide etched so as to form a pattern of salient blocks allowing the production of the aluminum layer and its projections.

Figure 18:
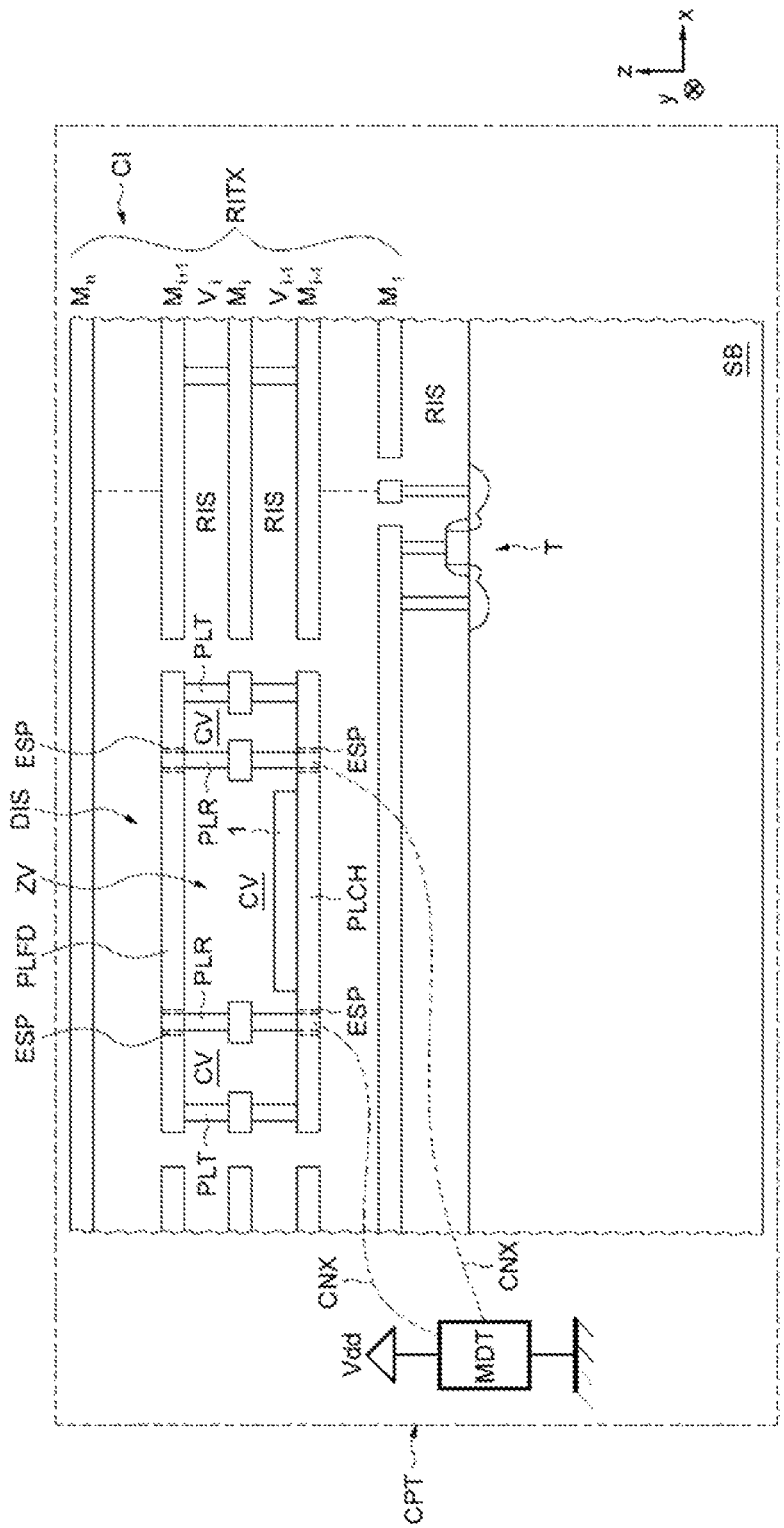
FIGS. 18 and 19 illustrate another embodiment of an integrated circuit according to the invention.
Figure 19:
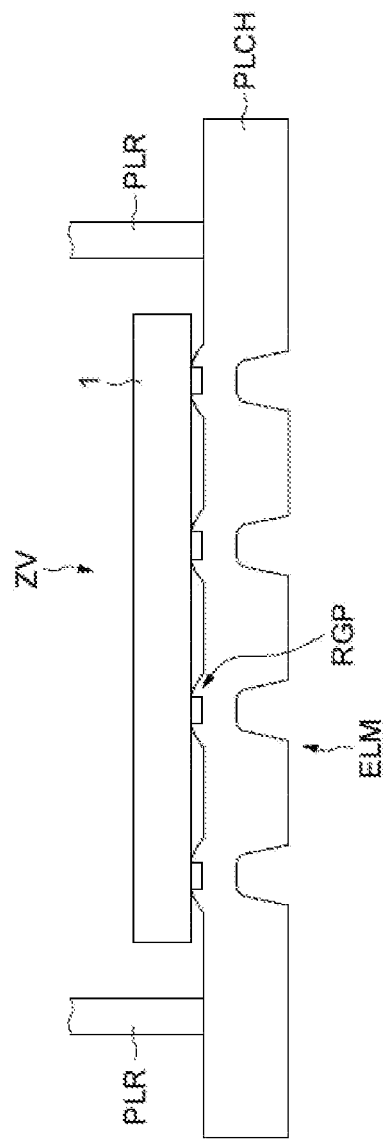

Reference is now made to FIGS. 18 and 19 to illustrate a use of a pointed element in a system for detecting the spatial orientation and/or the change of this orientation of an integrated circuit. An exemplary system for detecting orientation and/or change of orientation is described in French patent application No. FR1252988.

Certain characteristics thereof are recalled here.

Referring to FIG. 18, it is seen that the system DIS for detecting spatial orientation and/or the change of orientation of the integrated circuit CI is produced within several metallization levels (here three metallization levels $M_{i-1}$, $M_i$, $M_{i+}$, and two levels of vias $V_{i-1}$, $V_i$) of the interconnection part RITX (BEOL) of the integrated circuit CI. The metal is for example aluminum.

The system DIS comprises a housing or cavity CV whose walls comprise metallic portions produced within various metallization levels.

In the present case, the system DIS comprises a floor wall PLCH produced at the metallization level $M_{i-1}$, a ceiling wall PLFD produced at the metallization level $M_{i+1}$ and a lateral wall PLT comprising metallic portions produced at the metallization level $M_i$ and vias produced at the levels of vias $V_{i-1}$ and $V_i$.

The system DIS also comprises a metallic piece 1 housed in the housing CV and mobile inside this housing.

The system DIS also comprises a check mechanism, for example pillars PLR, defining inside the housing an evolution zone ZV for the metallic piece and comprising less two electrically conducting elements, for example the pillars PLR, disposed at the boundary of the evolution zone.

The metallic piece 1 is configured so as, under the action of gravity, to come into contact with the pillars PLR in response to at least one given spatial orientation of the integrated circuit.

The integrated circuit also comprises detection mechanism MDT configured to detect an electrical link passing through the piece and the electrically conducting elements PLR.

This mechanism MDT is, in the example described, connected to the pillars PLR by a connection CNX which can be produced in various ways, for example by way of vias and of metallic tracks at different levels of the integrated circuit.

Moreover, in certain cases, it may be necessary to electrically insulate the pillars PLR from the bottom wall and floor wall PLCH and PLFD. In this case, an insulating space ESP is made around the metallic portion of the wall PLCH which supports a pillar PLR.

The mechanism MDT, supplied between a supply voltage Vdd and earth, are of conventional and known structure. It is possible in this regard to use any appropriate logic circuit.

The mechanism MDT has been represented in a schematic manner outside the integrated circuit. This could actually be the case if this mechanism MDT is produced as a distinct component of the integrated circuit. Of course, this mechanism MDT could also be integrated into the integrated circuit CI.

Initially, the piece 1 is in this example a metallic portion of the metallization level Mi, encapsulated in an isolating region part. After removal of this isolating region part, so as to form the cavity CV, the piece 1 becomes mobile and, in the case illustrated in FIG. 18, falls by gravity onto the floor wall PLCH.

When the integrated circuit is in a horizontal position, as illustrated in FIG. 18, the piece 1 and the pillars PLR are mutually arranged in such a way that the piece 1 does not come into contact with at least two pillars PLR. No electrical link is detected by the detection mechanism MDT. This is consequently representative of a flat integrated circuit CI.

On the other hand, if the integrated circuit CI is tilted, the piece 1 will then under the action of gravity slide on the floor wall PLCH so as to contact at least two pillars PLR. An electrical link between these two pillars PLR will be able to be detected by the mechanism MDT. As a function of the location of the pillars PLR with which the piece 1 has come into contact, it is then possible to detect that the integrated circuit CI has taken a given orientation, or at the very least an orientation included in a given range of orientations.

So as to limit a risk of sticking of the piece 1 on the floor wall PLCH and consequently to favor the sliding of the piece 1 on this floor wall, it is particularly advantageous, as illustrated in FIG. 19, to provide for this floor wall PLCH to incorporate a pointed element ELM directing its pointed regions towards the metallic piece 1 inside the evolution zone ZV. The element ELM is ridded of the subjacent support that served for its formation as well as of the second material that served for the formation of the pointed regions.

Here again the system DIS is produced with conventional steps for fabricating metallization levels and vias. The levels of vias are also used to form a protection wall for the oxide etching which will allow the formation of the cavity CV.

Moreover, the element ELM of the floor PLCH is produced in a manner analogous to what was described hereinabove with reference to FIGS. 1 to 7 by using for example as subjacent support silicon dioxide etched so as to form a pattern of salient blocks allowing the production of the aluminum layer and its projections.

What is claimed is:

1. A method for producing an integrated circuit pointed element, the method comprising:
    forming an element having a dome shaped projection, the element comprising a first etchable material, a support underlying the element, the dome shaped projection positioned over an underlying block that protrudes from the support;
    forming a zone around the dome shaped projection, the forming the zone comprising:
        forming a second etchable material that is less rapidly etchable than the first etchable material for a particular etchant over the dome shaped projection; and
        thinning the second etchable material until a major surface of the second etchable material is substantially planar with a crown of the dome shaped projection;
    etching the first etchable material and the second etchable material with the particular etchant to form an open crater in the dome shaped projection, the open crater having a first sidewall and a second sidewall opposite the first sidewall of the open crater, the first sidewall of the open crater comprising the pointed element, wherein the open crater does not penetrate completely through the dome shaped projection and a first distance from the first sidewall of the open crater to the second sidewall of the open crater is less than a second distance from a first sidewall of the block to a second sidewall of the block that is opposite the first sidewall of the block;
    forming a conductive layer overlying the pointed element; and
    removing the support underlying the element.

2. The method according to claim 1, wherein thinning the second etchable material until the major surface of the second etchable material is substantially planar with the crown of the dome shaped projection comprises thinning the second etchable material until the crown of the dome shaped projection is abraded by the thinning.

3. The method according to claim 2, wherein forming the open crater comprises simultaneously etching the first etchable material and the second etchable material.

4. The method according to claim 3, further comprising removing the second etchable material after simultaneously etching the first etchable material and the second etchable material.

5. The method according to claim 1, wherein the element and the dome shaped projection comprise the same first etchable material.

6. The method according to claim 5, wherein forming the element comprises forming the support, the support comprising the block, and performing a compliant deposition of a layer of the first etchable material on the support, part of the layer overlapping the block forming the dome shaped projection.

7. The method according to claim 1, wherein forming the element comprises forming an element having a plurality of dome shaped projections, wherein the first etchable material and the second etchable material are etched so as to form an open crater in each dome shaped projection and thus to form a plurality of pointed regions.

8. The method according to claim 7, wherein forming the element comprises forming the support, the support comprising a plurality of blocks, the block being one of the plurality of blocks and performing a compliant deposition of a layer of the first etchable material over the support, parts of the layer overlapping the blocks forming the dome shaped projections.

9. The method according to claim 1, wherein the second etchable material is etched at least twice as quickly by the particular etchant as the first etchable material.

10. The method of claim 1, wherein the first etchable material comprises aluminum, and wherein forming the element having a dome shaped projection comprises depositing aluminum using physical vapor deposition.

11. The method of claim 1, wherein the underlying block is monolithically formed with the support, and wherein removing the support underlying the element comprises removing the underlying block with the support.

12. The method of claim 1, wherein:
    prior to the removing step, the dome shaped projection comprises an upper convex surface and a lower concave surface abutting the underlying block; and
    removing the support underlying the element comprises exposing both the upper convex surface and the lower concave surface.

13. A method of forming a device, comprising:
    forming a first beam in a first level of metallization of an integrated circuit;
    forming a second beam in the first level of metallization, an elongated axis of the first beam being parallel to an elongated axis of the second beam;
    forming a pointer in the first level of metallization, the first beam and the second beam contacting the pointer, the first beam being offset from the second beam along an elongated axis of the pointer;
    forming a third beam in the first level of metallization, the third beam having a pointed element on an upper surface of the third beam, wherein forming the third beam comprises:

forming an element having a dome shaped projection, the element comprising a first etchable material;

forming a zone around the dome shaped projection, the forming the zone comprising:

forming a second etchable material over the dome shaped projection, wherein the second etchable material has a lower etching rate than the first etchable material for a particular etchant; and thinning the second etchable material until a major surface of the second etchable material is substantially planar with a crown of the dome shaped projection; and etching the first etchable material and the second etchable material with the particular etchant to form an open crater in the dome shaped projection, the open crater having a sidewall comprising the pointed element, wherein the open crater does not penetrate completely through the dome shaped projection;

forming a fourth beam in a second level of metallization, the fourth beam comprising a conductive layer overlying the pointed element on the upper surface of the third beam; and forming a via underlying the fourth beam, an end of the via that faces the first level of metallization having a beveled shape.

14. The method according to claim 13, wherein the fourth beam is secured to a housing at an end of the fourth beam that opposes the via.

15. The method according to claim 13, wherein the third beam comprises a plurality of pointed elements on the upper surface of the third beam.

16. The method according to claim 13, further comprising forming a logic circuit, the logic circuit being connected to the pointer and the fourth beam, and the logic circuit being configured to detect that the pointer is electrically connected to the fourth beam.

17. The method according to claim 16, wherein the logic circuit is formed in a different part of the integrated circuit than the device.

18. A method of forming a device, comprising:

forming a first beam in a first level of metallization of an integrated circuit;

forming a second beam in the first level of metallization, an elongated axis of the first beam being parallel to an elongated axis of the second beam;

forming a pointer in the first level of metallization, the first beam and the second beam contacting the pointer, the first beam being offset from the second beam along an elongated axis of the pointer;

forming a third beam in the first level of metallization, the third beam having a pointed element on an upper surface of the third beam, wherein forming the third beam comprises:

forming an element having a dome shaped projection, the element comprising a first etchable material, a support underlying the element at least during formation of the element, the dome shaped projection positioned over an underlying block that protrudes from the support;

forming a zone around the dome shaped projection, the forming the zone comprising:

forming a second etchable material over the dome shaped projection, wherein the second etchable material has a lower etching rate than the first etchable material for a particular etchant; and thinning the second etchable material until a major surface of the second etchable material is substantially planar with a crown of the dome shaped projection; and etching the first etchable material and the second etchable material with the particular etchant to form an open crater in the dome shaped projection, the open crater having a first sidewall and a second sidewall opposite the first sidewall of the open crater, the first sidewall of the open crater comprising the pointed element, wherein the open crater does not penetrate completely through the dome shaped projection and a first distance from the first sidewall of the open crater to the second sidewall of the open crater is less than a second distance from a first sidewall of the block to a second sidewall of the block that is opposite the first sidewall of the block;

forming a fourth beam in a second level of metallization, the fourth beam comprising a conductive layer overlying the pointed element on the upper surface of the third beam; and forming a via underlying the fourth beam, an end of the via that faces the first level of metallization having a beveled shape.

19. The method according to claim 18, wherein the fourth beam is secured to a housing at an end of the fourth beam that opposes the via.

20. The method according to claim 18, wherein the third beam comprises a plurality of pointed elements on the upper surface of the third beam.

21. The method according to claim 18, further comprising forming a logic circuit, the logic circuit being connected to the pointer and the fourth beam, and the logic circuit being configured to detect that the pointer is electrically connected to the fourth beam.

22. The method according to claim 21, wherein the logic circuit is formed in a different part of the integrated circuit than the device.

* * * * *